US005876796A

United States Patent [19]

Regolini et al.

[11] Patent Number: 5,876,796

[45] Date of Patent: Mar. 2, 1999

[54] PROCESS FOR SELECTIVELY DEPOSITING A REFRACTORY METAL SILICIDE ON SILICON, AND SILICON WAFER METALLIZED USING THIS PROCESS

[75] Inventors: Jorge Regolini, Bernin; Daniel Bensahel, Grenoble, both of France

[73] Assignee: France Telecom, France

[21] Appl. No.: 797,511

[22] Filed: Dec. 23, 1996

[30] Foreign Application Priority Data

Dec. 22, 1995 [FR] France .................................. 95 15327

[51] Int. Cl.[6] ...................................................... C23C 16/42

[52] U.S. Cl. ................... 427/255; 427/255.2; 427/255.3; 427/255.4; 427/255.7; 438/677; 438/683

[58] Field of Search ................................ 427/255, 255.2, 427/255.3, 255.4, 255.7, 99; 438/654, 655, 628, 630, 649, 644, 677, 683

[56] References Cited

U.S. PATENT DOCUMENTS

| | | | |
|---|---|---|---|
| 4,337,476 | 6/1982 | Fraser et al. | 357/67 |
| 4,501,769 | 2/1985 | Hieber et al. | 427/95 |
| 5,294,571 | 3/1994 | Fujishiro et al. | 437/239 |
| 5,500,249 | 3/1996 | Telford et al. | 427/255 |
| 5,516,730 | 5/1996 | Saeed et al. | 437/235 |

FOREIGN PATENT DOCUMENTS

| | | |
|---|---|---|
| 44238080A1 | 11/1992 | Germany . |
| 95/15005 | 6/1995 | WIPO . |

OTHER PUBLICATIONS

Formation of self–aligned $TiSi_2$ contacts to Si at low temperatures . . . 6046 Materials Letters 17(1993) Oct., No. 6, Amersterdam, NL.

*Primary Examiner*—Shrive Beck
*Assistant Examiner*—Timothy Meeks
*Attorney, Agent, or Firm*—Fulbright & Jaworski L.L.P.

[57] ABSTRACT

Process for selectively depositing a refractory metal silicide on a surface of a monocrystalline or polycrystalline silicon wafer, comprising: a step of preparing said surface, consisting in forming a silicon oxide or silicon oxynitride layer having a thickness e≦1 nm on this surface; and, on the silicon oxide or oxynitride layer formed, a step of selective vapor deposition of a refractory metal silicide.

21 Claims, 2 Drawing Sheets

PROCESS FOR SELECTIVELY DEPOSITING A REFRACTORY METAL SILICIDE ON SILICON, AND SILICON WAFER METALLIZED USING THIS PROCESS

TECHNICAL FIELD

The present invention relates to the field of fabricating silicon semiconductor integrated circuits, and more precisely to metallizing silicon semiconductor devices by depositing a refractory metal silicide in order to produce contacts and/or interconnections in these integrated circuits.

BACKGROUND

Integrated circuits of this type include a considerable number of electronic components produced in the silicon wafer. These electronic components are activated by making metal contacts on the various active regions of said components. These contacts are connected to the contacts of the other components by interconnections in order to make the integrated circuits capable of functioning. Thus, for example, in order to activate a bipolar transistor, contacts must be made on the collector, base and emitter regions; and in order to activate a (MOS) field-effect transistor, contacts must be made on the source and drain regions and on the polycrystalline silicon gate.

The contacts and interconnections in an integrated circuit may not only be metal but also made of a metal silicide, in particular a refractory metal silicide.

The regions on which these contacts and interconnections are to be produced are subjected to metallization. The silicon regions to be metallized are referred to as bare silicon regions, as opposed to the other silicon regions of the wafer which are covered by an insulator, in particular by silicon oxide. The bare silicon regions can be metallized using various methods, for example depositing a refractory metal silicide.

Although keeping a general scope, the invention will be described more particularly with reference to the metallization of integrated circuit silicon semiconductor devices including (MOS) field-effect transistors in technologies with design rules of less than 0.5 $\mu$m, commonly referred to as sub-0.5 $\mu$m technologies. These technologies more precisely correspond to a length of less than 0.5 $\mu$m for the channel separating the source and drain regions of the transistor. These very small transistors make it possible to produce integrated circuits with high integration level which are of great interest in microelectronics, for example integrated circuits of the VLSI and ULSI type.

In sub-0.5 $\mu$m technologies, the source and drain junctions are located at about 0.1 $\mu$m below the surface of the bare silicon. In order to ensure that these transistors, and therefore the integrated circuit, function properly these shallow source and drain junctions must be preserved when making contacts.

Furthermore, acceptable metallization of the bare silicon regions for integrated circuits with high integration level must generate a uniform deposit in which the grain size of the deposited particles is sufficiently small for the surface of the deposited layer to have little roughness. These characteristics are essential for proper functioning of integrated circuits fabricated in sub-0.5 $\mu$m technologies.

Various prior art processes make it possible to deposit refractory metal silicides on bare silicon.

In particular, it is known from U.S. Pat. No. 4,619,038 to metallize the source and drain regions, as well as the polycrystalline silicon gate of a field-effect transistor using a first deposit of a titanium silicide layer, by placing the silicon wafer, partially masked by silicon oxide, in an enclosure comprising, as the reactive gas, a titanium halide diluted in hydrogen. A titanium silicide layer is thus formed on the bare monocrystalline and polycrystalline silicon regions at temperatures of between 700° and 1000° C.

When this process is implemented, a large amount of bare silicon is found to be consumed, which entails serious consequences since the titanium silicide will penetrate deeply into the regions to be metallized. This leads to a significant risk of the junctions being pierced, in particular the shallow source and drain junctions which are located at about 0.1 $\mu$m below the surface of the bare silicon in sub-0.5 $\mu$m technologies.

This method has the additional drawback of a deposit having a high degree of surface roughness. These defects of the titanium silicide deposit are deemed unacceptable, in particular in the sub-0.5 $\mu$m technologies mentioned above.

Another U.S. Pat. No. , 4,501,769, describes a process for selectively depositing a refractory metal silicide on monocrystalline and polycrystalline silicon, which employs a mixture of reactive gases comprising a silicon precursor gas. The purpose of this mixture of reactive gases is to prevent consumption of the bare silicon of the substrate on which the selective deposition takes place.

However, deposition of this type requires a reaction temperature of about 850° C., at which temperature, in the presence of the refractory metal precursor, reaction with the bare silicon of the wafer is inevitable. The risk of the junctions being pierced cannot therefore be completely eliminated when the process is applied to field-effect transistors, in particular in the sub-0.5 $\mu$m technologies.

Furthermore, the silicide layers formed when using the process described in U.S. Pat. No. 4,501,769 have a large grain size and therefore a high degree of surface roughness, which characteristic is deemed unacceptable for the intended applications as described above.

French Patent Application 2 623 014 describes a method for selectively depositing a refractory metal silicide, which proposes to overcome such drawbacks constituted by the high degree of surface roughness and the consumption of bare silicon.

According to the process which is described, the wafers are deoxidized during a first step, referred to as a cleaning step. This cleaning step consists in refractory metal silicide deposition, with a stoichiometric excess of silicon, by heating a gas mixture of silane, titanium tetrachloride, argon and hydrogen to a temperature of between 800° C. and 1000°. This deposition with a stoichiometric excess of silicon is intended to suppress the native oxide $SiO_2$ which is formed on the silicon regions to be metallized. In a second step, at a lower temperature, between 450° C. and 700° C., a refractory metal silicide layer, with a stoichiometric amount of silicon, is deposited in the presence of the same gas mixture but at different partial pressures.

The first step seems to obtain a lower degree of surface roughness for the $TiSi_2$ deposited. This result can be interpreted by elimination of the native oxide, the presence of which would interfere with the selective deposition of titanium silicide. Indeed, it seems that the selectivity of the deposition and the presence of native oxide promotes deposition in islands, firstly starting in the nucleation regions which are free of native oxide. Deposition of this type generates coarse-grain layers with a high degree of surface roughness.

The second step, the deposition step proper, is carried out with the aim of limiting the consumption of bare silicon which could take place in the presence of titanium tetrachloride.

The authors of the present invention have observed that, when the process described in Patent Application FR 2 623 014 is implemented, consumption of the bare silicon persists. Therefore, for applications in the technologies mentioned above, the risk of the shallow junctions being pierced remains. Furthermore, the refractory metal silicide layer which is formed still includes surface defects, such as grains which are excessively large and a degree of surface roughness which is too great for use in sub-0.5 $\mu$m technologies with high integration level.

Furthermore, the authors of the present invention have also demonstrated that the titanium silicide layer obtained using this method is formed by two different crystallographic phases of titanium silicide, one of which has a resistivity which is much too great for application to the fabrication of integrated circuits with a high integration level. Indeed, circuits of the VLSI type have their performance considerably restricted when the resistivity of the contact and interconnection levels is too high.

French Patent Application No. 94 09819 describes a process for selective vapor deposition of a silicide of a refractory metal on the monocrystalline and polycrystalline silicon of a silicon wafer, comprising the following steps:

(i) a cleaning step intended to prepare the silicon surface for the deposition, by making it free not only of native oxide but also of all other residues and impurities present at the surface of the silicon;

(ii) a step of depositing a silicon layer in order to form a silicon pedestal on the actual monocrystalline and polycrystalline silicon of the wafer; and (iii) a step of vapor deposition of a refractory metal silicide, at least partially consuming the silicon pedestal formed during the preceding step.

This process makes it possible to control the consumption of the silicon of the wafer because it appears that the silicon pedestal provided by step (ii) is at least partially, if not completely, consumed in order to form the layer of the refractory metal silicide; the bare silicon of the wafer is thus protected by the pedestal during the deposition in step (iii).

It furthermore appears that the deposit thus obtained on a silicon surface free of native oxide and all types of residues and impurities makes it possible to grow small grains, leading to a uniform layer, with a low degree of surface roughness, which is compatible with sub-0.5 $\mu$m technologies, such as those with a high integration level.

In order to rid the silicon surface to be metallized of native oxide and all the residues and impurities due, in particular, to the technological treatments to which the wafer may already have been subjected, for example etching or implantation, which in particular leave carbon residues, cleaning methods are used, the selection of which depends on these prior technological treatments. Cleaning methods which can be used are, in particular, cleaning methods assisted by plasma (soft-etch), by sacrificial oxide (5 to 45 nm), by the two consecutive methods, by chemical treatment, for example by treatment of the RCA type, by the action of dilute HF or by these two consecutive methods, or by any other suitable method which leaves the silicon surface free of residues, impurities and native oxide.

When the wafers have been subjected to certain prior technological treatments, it is possible that the silicon surfaces thus cleaned may not be entirely free of residues. The silicide deposition on a surface of this type could take place in islands and thus form a coarse-grained rough layer.

Application FR-A-94 09819 more particularly proposes to supplement this first cleaning phase with a second surface preparation phase referred to as "in situ" preparation since it may take place in the same reactor as the silicon layer deposition step (ii). As opposed to this, the first phase of the cleaning step, described above, is referred to as "ex situ" cleaning.

The fundamental utility of in situ preparation of this type consists in obtaining a deposit which meets specifications such as a low access resistance and continuity between two n and p doped regions. A surface which is as perfect as possible is thus obtained before the epitaxial Si deposition, followed by the $TiSi_2$ chemical vapor deposition (CVD).

Although satisfactory results have been obtained with the technique described in Application FR-94 09819, a tendency to the junctions being pierced has been observed, or in terms of materials, a growth of $TiSi_2$ propagating through the substrate by consuming the Si of the substrate, thus piercing the junctions. In spite of the formation of the silicon pedestal, and in spite of the supply of silicon by the gas phase ($SiH_4$+$TiCl_4$), such a tendency to the junctions being pierced is observed.

The influence of the presence of a controlled-thickness oxide layer for the fabrication of certain semiconductor devices has also been studied.

Thus, the article entitled "Application of a Cluster Tool for Interface Engineering of Polysilicon Emitters" R. H. Reuss, C. Werkhoven, E. Granneman, M. Hendricks, IEEE 1993 Bipolar Circuits and Technology Meeting 3.4, CH3315-9/93/0000(0049)$1.00© 1993 IEEE describes the production of a high-quality ultrathin oxide layer using a high-temperature oxidation process before depositing polysilicon to form the emitter of a bipolar transistor in a cluster tool. This article mentions that a high current gain is obtained, but that the resistance of the emitter is detrimentally affected.

Consideration has also be given to forming a subnanometric oxide layer between a polysilicon deposit and a doped substrate in a cluster tool. The presence of the subnanometric oxide layer makes it possible to adjust the current gain of high-speed poly-emitter bipolar transistors to the desired values while simultaneously reducing the contact resistance of the collector.

Finally, it has been suggested to obtain subnanometric layers of silicon oxide by ozonizing, and of silicon oxynitride by treating silicon wafers with NO in order to promote the subsequent deposition of a polysilicon layer.

SUMMARY

The object of the present invention is to provide a process for depositing refractory metal silicide on a surface of a monocrystalline or polycrystalline silicon wafer, in which the growth of the refractory metal silicide by consumption of the silicon of the substrate is prevented, thus avoiding the risk of the junctions being pierced.

According to the invention, the above objects are achieved by implementing a process for selectively depositing a refractory metal silicide on a surface of a monocrystalline or polycrystalline silicon wafer, characterized in that it comprises:

a step of preparing said surface, consisting in forming a layer, of thickness e$\leqq$1 nm, of silicon oxide or silicon oxynitride on this surface; and a step of selective chemical vapor deposition (CVD), on the silicon oxide or oxynitride layer, of a refractory metal silicide.

The silicon oxide or silicon oxynitride layer of the present invention, hereafter referred to as subnanometric thickness layer, should have specific characteristics for implementing the process according to the invention:

it should block the progression of the growth of the refractory metal silicide during the step of depositing this silicide and, in particular, it should not evaporate during the deposition of the refractory metal silicide by CVD, for example under the reducing action of the hydrogen or the $SiH_4$ which are used in this step;

it should be reproducible;

it should be thin enough not to act as a thick oxide surface, such as a thick $SiO_2$ surface, in which case there would not be selective refractory metal silicide deposition.

It should also be thin enough to ensure ohmic contact between the refractory metal silicide deposit and the underlying doped regions of the silicon wafer.

It has been found, according to the invention, that a thickness $e \leqq 1$ nm for this silicon oxide or oxynitride layer makes it possible to obtain the desired results. Preferably, the silicon oxide or oxynitride layer has a thickness of between 0.1 and 1 nm, and still better a thickness of the order of 0.5 to 0.9 nm. The silicon oxide layer will preferably be a layer satisfying the formula SiOx, in which x is $\leqq 2$. The silicon oxide particularly recommended according to the invention is silicon dioxide $SiO_2$.

The silicon oxynitride layer satisfies the general formula SiOxNy, in which x is $\leqq 3$ and y is $\leqq 4$.

Before proceeding to the step of depositing the subnanometric silicon oxide or oxynitride layer, it is preferable to rid the surface of the silicon wafer to be treated of native oxide and all the residues and impurities due, in particular, to the technological treatments to which the wafer may already have been subjected, for example etching or implantation which, in particular, leave carbon residues. Cleaning methods can be used for this purpose, the choice of which depends on these previous technological treatments. Cleaning methods which can be used are, in particular, cleaning methods assisted by plasma (soft-etch), by sacrificial oxide (5 to 45 nm), by the two consecutive methods, by chemical treatment, for example by treatment of the RCA type, by the action of dilute HF or by these two consecutive methods, or by any other suitable method which leaves the silicon surface free of residues, impurities and native oxide.

One recommended cleaning method consists in immersing the wafer in a dilute aqueous hydrofluoric acid solution.

The silicon oxide or silicon oxynitride layer may be deposited using any known process which makes it possible to obtain a controlled thickness $\leqq 1$ nm for the layer.

In particular, the subnanometric silicon oxide layer may be obtained by oxidation under rapid annealing, by passage through a furnace with an oxidizing atmosphere, by exposure of the wafer to an oxidizing atmosphere containing ozone, or by immersion of the wafer in water containing ozone.

Exposure to an atmosphere containing ozone is particularly recommended. This process consists in exposing a silicon wafer, previously cleaned in an aqueous HF solution, to an oxidizing atmosphere consisting of a mixture of $O_2$ and $O_3$. The exposure takes place under atmospheric or reduced pressure, preferably 100 mbar, at a temperature of 20° to 400° C., preferably 20° to 200° C., for a time of from a few tens of seconds to 10 minutes, preferably 60 seconds. Also preferably, the volume ratio of the ozone concentration to the oxygen concentration is 3%. For more details regarding this process, reference may be made to the article "Controlled thin oxidation and nitridation in a single wafer cluster tool" I. Sagnes et al. MRS 95 Spring Meeting, San Francisco.

Under the conditions indicated above, silicon oxide ($SiO_2$) layers with thicknesses ranging from 0.5 to 0.8 nm are obtained.

A subnanometric silicon oxide layer can be formed in an atmosphere containing oxygen (for example air) using a reactor of the cluster tool type.

The growth of the oxide layer is determined by the choice of the oxygen content in the atmosphere, the pressure, the temperature and the duration of the oxidation. By employing an oxidation step of this type using a reactor of the cluster tool type, oxide layers from 0.2 to 1.0 nm can be produced.

The silicon oxynitride (SiOxNy) layer of the present invention can be formed either directly on the cleaned surface of the silicon wafer or by nitriding a subnanometric silicon oxide layer previously deposited on the surface of the wafer.

Direct deposition of the silicon oxynitride layer can be carried out by bringing the surface of the wafer into contact with an atmosphere containing $NH_3$, $N_2O$ or NO. An atmosphere containing NO (in particular pure NO) is preferably used because it makes it possible to use temperatures which are relatively lower.

The oxide layers previously formed may be nitrided by bringing the silicon oxide layer formed into contact with an atmosphere containing $N_2O$ or NO. An atmosphere containing NO is recommended for the same reasons as before. The nitriding is generally carried out at a temperature of between 700° C. and 900° C., preferably between 700° C. and 800° C. For more details on this process, reference may be made to the abovementioned article "Controlled thin oxidation and nitridation in a single wafer cluster tool".

The next step in the process is selective vapor deposition of a refractory metal silicide. In combination with the presence of the subnanometric protective layer, the deposition method of the present invention, a chemical vapor deposition, constitutes an essential characteristic of the present invention. This is because the subnanometric protective layer, the function of which is to prevent the progress of the growth of the refractory metal silicide deposit by consuming the silicon of the wafer, should not evolve during the deposition of the refractory metal silicide. Thus, if use is made of the conventional technique for depositing refractory metal silicide, known in CMOS technology, which consists in sputtering, for example, Ti to form a $TiSi_2$ layer, the surface layer is completely reduced. Consequently, in this case there is virtually no longer a protective layer to prevent the consumption of the silicon of the wafer, and there is a risk of the junctions being pierced.

After the step of depositing the silicon oxide or oxynitride layer, the wafer is placed in a vapor deposition chamber of a suitable reactor. The deposition takes place in the presence of at least one silicon precursor gas and of at least one refractory metal precursor gas which are deleted in hydrogen at partial pressures of, respectively, between 0.25 and 1.0 Pa, 0.05 and 0.2 Pa and 260 and 1500 Pa.

Since one of the objects of the invention is to deposit a selective silicide layer with small grain size, the invention may advantageously be implemented by applying a temperature profile such that the temperature is increased in successive stages between 700° C. and 800° C. This is because applying a temperature profile of this type has proved to contribute considerably to minimizing the grain size of the silicide deposit yet further.

The silicon precursor gases are chosen from the precursor gases normally used in silicon technology. Silane or dichlorosilane is preferably chosen.

The preferred refractory metal is titanium, and titanium tetrachloride will then be chosen as the reactive gas.

For example, using the gas mixture $SiH_4$, $TiCl_4$ and $H_2$ is recommended. For its part, using the mixture $SiH_2Cl_2$, $TiCl_4$ and $H_2$ leads to the deposition of a silicide layer with a smaller grain size than the former mixture.

The metal silicide deposition step preferably takes place by using a refractory metal precursor gas/silicon precursor gas ratio, for example $TiCl_4/SiH_4$ or any other deposition mixture, which varies during this step so as initially to promote the deposition of a silicon-rich layer. The flow of the precursor gas of the refractory metal, for example titanium, is then increased so that, at the end of the process, all of the deposit is a uniform layer of refractory metal silicide, for example $TiSi_2$. The initial silicon-rich deposit is thus consumed by progressive addition of refractory metal, for example titanium, to form the layer of refractory metal silicide, for example $TiSi_2$.

In the case, already mentioned, in which an insulator, or another material, surrounds the regions of the wafer to be metallized, the deposition of refractory metal silicide on these regions is selective. The invention advantageously proposes the addition of germanium to the mixture of reactive gases, in proportions of less than 10% by volume of the total gas mixture. This is because germanium improves the selectivity of the process.

The presence of germanium furthermore affords the advantage of contributing to minimizing the grain size and to obtaining better uniformity in the deposit.

In order to avoid superfluous operations or risks of recontamination between the various steps of the process according to the invention, this process may advantageously be implemented in a cluster tool, or cluster type reactor, which makes it possible to move the silicon wafer from chamber to chamber within the same enclosure without breaking the controlled atmosphere of the ultra-clean environment in which the wafer is immersed from the in situ cleaning phase onward.

DRAWINGS

FIG. 1 is a schematic section of a field effects transistor.

FIG. 2 corresponds to FIG. 1, but after deposition of a silicon oxide layer.

FIG. 3. corresponds to FIG. 2, but after deposition of a metal suicide layer.

DETAILED DESCRIPTION

Figure 1:
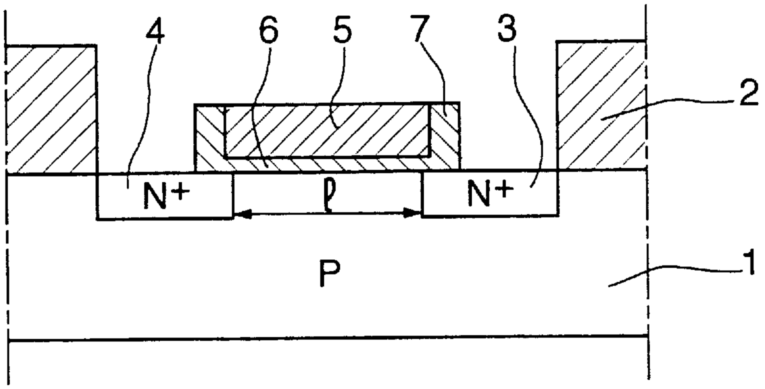

FIG. 1 schematically illustrates a section of a field-effect transistor formed in a p-doped silicon substrate (1) and inside a region delimited by a field oxide (2). This transistor comprises $n^+$-doped source (3) and drain (4) regions separated by a channel region with a length l of less than 0.5 $\mu$m and surmounted by a polycrystalline silicon gate (5) laid on a thin silicon oxide (6) and laterally insulated by silicon oxide spacers (7).

Figure 2:
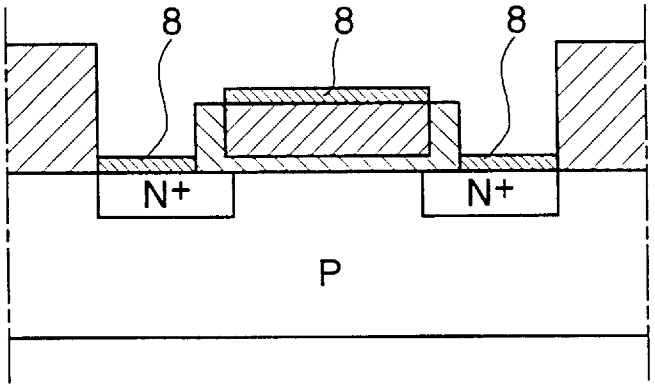

FIG. 2 schematically illustrates the section of the same field-effect transistor after having undergone the cleaning step and the step of selectively depositing a silicon oxide layer (8) according to the above-described process of the invention. The ex situ phase of the cleaning step consisted of a chemical treatment. The cleaning step was followed by the step of depositing, in the chamber of a reactor of the cluster tool type, a nanometric silicon oxide layer (8), in particular on the clean bare monocrystalline and polycrystalline silicon.

Figure 3:
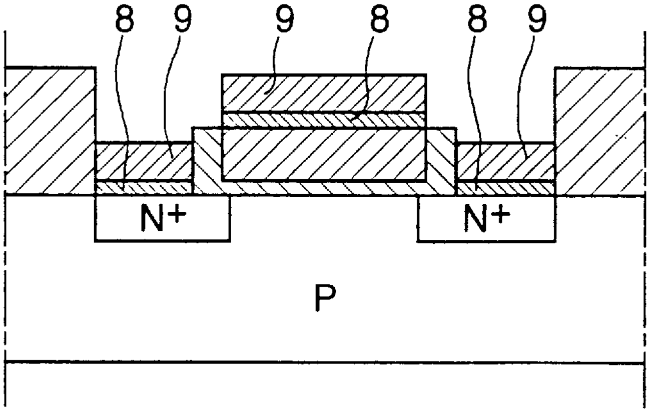

FIG. 3 schematically illustrates a section of the same field-effect transistor after having undergone the step of selective vapor deposition of a refractory metal silicide layer (9) according to the process of the invention.

In the case of FIG. 3, the selective vapor deposition was implemented in the deposition chamber of the reactor of the cluster tool type. A temperature profile was then applied by increasing the temperature, in successive stages, between 700° C. and 800° C., in the presence of a mixture of reactive gases $SiH_2Cl_2$ or $SiH_4$ and $TiCl_4$ which are diluted in hydrogen, the respective partial pressures being within the ranges mentioned above.

According to the process of the invention, selective deposition of refractory metal silicide may be carried out on the regions of the wafer which are covered solely with a subnanometric silicon oxide layer without the risk of piercing the shallow junctions. The silicide layer deposited is homogeneous, uniform and has a small grain size, which leads to a very low degree of surface roughness. The results obtained with the process of the invention are compatible with sub-0.5 $\mu$m technologies and, in particular, for the fabrication of integrated circuits with high integration level.

Furthermore, it has been found that the silicide layer formed includes only a single silicide crystalline phase with very low resistivity. This is a considerable advantage, especially in high integration level technologies.

The process according to the invention has the additional advantage of eliminating the risks of delaminating the integrated circuits.

This process can be implemented advantageously for fabricating integrated circuits in sub-0.5 $\mu$m technologies, in particular with high integration level, for example in VLSI and ULSI technologies, and also for fabricating any type of integrated circuit and, more generally, for metallizing any silicon devices.

A further subject of the invention is wafers for integrated circuits, in particular with high integration level, the interconnections and/or at least one contact level of which are produced by selective vapor deposition of a refractory metal silicide layer on the regions of the silicon wafer solely covered by a subnanometric silicon oxide or oxynitride layer according to the method described above.

The contacts or interconnections produced using this process have very low electrical resistance and are thermally stable. They furthermore serve as barriers to the diffusion of other elements outside the contact, for example metals such as Al, Na, etc. originating, for example, from a second contact level, toward the silicon of the substrate where the buried junctions are located.

The integrated circuits, in particular with high integration level, comprising metallized wafers of this type have a higher performance level than integrated circuits including silicon wafers metallized according to the various prior art processes.

The following example is intended to illustrate the invention, but without limiting it to this application.

EXAMPLE

A silicon wafer is taken, which has been subjected to the conventional preparation steps required to form therein the contacts on the source, drain and gate junctions.

At this stage, the wafer is subjected to chemical cleaning, consisting in:

exposing the surface of the wafer to be treated to a soft plasma (low power ≦50 W) $CF_4/O_2$; and etching with a 1% HF solution for 1 minute.

The cleaned wafer is then introduced into a cluster tool where the wafer is subjected to a flow of an $O_3/O_2$ mixture with 3% by volume of ozone, for a time of about 50 seconds at 100° C. under a total pressure of 100 mbar.

By a conventional in situ ellipsometry/spectroscopy measurement, it is confirmed that the thickness of the silicon oxide layer formed is less than 1 nm.

The wafer is then transferred under controlled atmosphere (for example $N_2$, $H_2$ or any atmosphere which is inert with respect to the formation of the oxide layer) into another module of the cluster tool in order therein to carry out the step of selective vapor deposition of the refractory metal silicide.

In this module, the surface is desorbed under reduced hydrogen pressure 266.6 Pa (20 torr) at a temperature of about 700° C. for a few seconds.

A flow of a silane-rich gas mixture (of the order of 90% by volume) with a flow rate of the order of 50 $cm^3/s$ is introduced into the reactor for about 1 minute at 800° C. The $TiCl_4$ gas proportion in the mixture is then increased to obtain a mixture containing about 10% by volume of silane, until a $TiSi_2$ deposit of about 70 nm is obtained after about 1 minute at a temperature of 750° C.

The wafer previously obtained is examined in cross section by scanning electron microscopy after cleaving the wafer. It is observed that the $TiSi_2$ layer has not penetrated the active regions.

We claim:

1. Process for selectively depositing a refractory metal silicide on selected areas of a monocrystalline or polycrystalline silicon wafer, said selected areas being surrounded by an insulating material, comprising the steps of:

(a) forming on said selected areas a silicon oxide or silicon oxynitride layer having a thickness of 1 nm or less; and, (b) depositing through selective chemical vapor deposition a refractory metal silicide layer on said selected areas, the thickness of said silicon oxide or silicon oxynitride layer being sufficient to prevent consumption of the silicon of the wafer during step (b).

2. Process according to claim 1, wherein step (a) comprises an oxidation step for forming a silicon oxide layer having a thickness of 1 nm or less, followed by a step of nitriding the silicon oxide layer formed.

3. Process according to claim 2, wherein the nitriding step comprises exposure of the silicon oxide layer to an atmosphere containing NO or $N_2O$.

4. Process according to claim 3, wherein the nitriding step is carried out at a temperature of between 700° and 900° C.

5. Process according to claim 1, wherein step (a) comprises exposure of the selected areas to an atmosphere containing ozone.

6. Process according to claim 5, wherein the atmosphere containing ozone is a mixture of ozone and oxygen.

7. Process according to claim 5, wherein step a) is carried out at atmospheric pressure or under reduced pressure.

8. Process according to claim 5 wherein step a) is carried out at a temperature of between 20° and 200° C.

9. Process according to claim 5 wherein the exposure to the atmosphere containing ozone has a duration of between 2 and 10 minutes.

10. Process according to claim 1 wherein step (a) comprises immersion of the wafer in water containing ozone.

11. Process according to claim 1 wherein step (a) comprises oxidation of said selected areas under rapid annealing.

12. Process according to claim 1 wherein step (a) comprises oxidation of said selected areas in a furnace.

13. Process according to claim 1 further comprising prior to step, (a) a cleaning step for passivating the silicon wafer.

14. Process according to claim 13, wherein the cleaning step comprises contacting the silicon wafer with a dilute aqueous HF solution.

15. Process according to claim 1, wherein step b) is carried out in a vapor deposition chamber of a reactor in the presence of a gas mixture comprising at least one silicon precursor gas and at least one refractory metal precursor gas which are diluted in hydrogen, their respective partial pressure being between 0.25 to 1.0 Pa, 0.05 to 0.2 Pa and 260 to 1500 Pa.

16. Process according to claim 15, wherein, in step (b) the deposition temperature is increased in successive stages between 700° C. and 800° C.

17. Process according to claim 15 wherein the silicon precursor gas is silane or dichlorosilane and the refractory metal precursor gas is titanium tetrachloride.

18. Process according to claim 15 wherein the gas mixture further comprises germanium in proportions of less than 10% by volume of the gas mixture.

19. Process according to claim 1 wherein steps (a) and (b) are effected in a cluster reactor.

20. Process according to claim 1 wherein said thickness is at least 0.1 nm.

21. Process according to claim 1 wherein said thickness is at least 0.5 nm.

* * * * *